US009829535B2

(12) United States Patent
Balakrishnan et al.

(10) Patent No.: US 9,829,535 B2
(45) Date of Patent: Nov. 28, 2017

(54) TEST STRUCTURE TO MEASURE DELAY VARIABILITY MISMATCH OF DIGITAL LOGIC PATHS

(71) Applicant: International Business Machines Corporation, Armonk, NY (US)

(72) Inventors: Karthik Balakrishnan, New York, NY (US); Bruce M. Fleischer, Bedford Hills, NY (US); Keith A. Jenkins, Sleepy Hollow, NY (US); Christos Vezyrtzis, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 126 days.

(21) Appl. No.: 15/001,373

(22) Filed: Jan. 20, 2016

(65) Prior Publication Data
US 2016/0209467 A1 Jul. 21, 2016

Related U.S. Application Data

(60) Provisional application No. 62/105,902, filed on Jan. 21, 2015.

(51) Int. Cl.
*G01R 31/28* (2006.01)
*G01R 31/317* (2006.01)
(52) U.S. Cl.
CPC ... *G01R 31/2884* (2013.01); *G01R 31/31726* (2013.01)
(58) Field of Classification Search
CPC .......... G01R 31/31726; G01R 31/2884; G01R 31/2851; G01R 31/31727; G01R 31/31725; G01R 31/319; G01R 31/31721; G01R 31/2607; G01R 31/2882; G01R 31/3016; G01R 31/31858; G01K 13/00;
(Continued)

(56) References Cited

U.S. PATENT DOCUMENTS 7,086,023 B2    8/2006  Visweswariah
7,412,343 B2    8/2008  Stroud et al.
(Continued)

FOREIGN PATENT DOCUMENTS

CN    101581762    11/2009

OTHER PUBLICATIONS

A. Bassi et al. "Measuring the effects of process variations on circuit performance by means of digitally-controllable ring oscillators". 2003 IEEE, ICMTS 03, pp. 214-217.
(Continued)

*Primary Examiner* — Guerrier Merant
(74) *Attorney, Agent, or Firm* — Louis J. Percello; Otterstedt, Ellenbogen & Kammer, LLP

(57) ABSTRACT

An integrated circuit includes a test block which in turn includes a plurality of identical paths; a counter selectively coupled to the plurality of identical paths to selectively obtain a count of at least one of correctly operating paths and incorrectly operating paths from each of the plurality of identical paths; and a plurality of count latches selectively coupled to the counter to store output of the counter. Each path in turn includes a first clocked latch; a clocked logic path beginning and ending at the first clocked latch; and a clocked detection circuit coupled to the first clocked latch and the counter, which determines whether the clocked logic path is operating properly in a given clock period.

20 Claims, 7 Drawing Sheets

(58) Field of Classification Search
CPC ........ H03M 9/00; H04J 3/0629; H04J 3/0602; H04L 1/22; G06F 11/24
See application file for complete search history.

(56) References Cited

U.S. PATENT DOCUMENTS

| | | |
|---|---|---|
| 7,761,755 B1 | 7/2010 | Payakapan et al. |
| 8,244,492 B2 | 8/2012 | Hafed |
| 8,381,050 B2 | 2/2013 | Gillis et al. |
| 2010/0095170 A1 | 4/2010 | Fukuda et al. |

OTHER PUBLICATIONS

Manjul Bhushan et al. "Ring Oscillator Based Technique for Measuring Variability Statistics". 2006 IEEE, pp. 87-92.

C-H. Lin et al. "High Performance 14nm SOI FinFET CMOS Technology with 0.0174μm2 embedded DRAM and 15 Levels of Cu Metallization". 2014 IEEE, IEDM14. pp. 74-76.

Robert Pawlowski et al. "A 530mV 10-Lane SIMD Processor with Variation Resiliency in 45nm SOI" ISSCC 2012 / Session 28 / Adaptive & Low-Power Circuits / 28.8. 2012 IEEE International Solid-State Circuits Conference. pp. 492-494.

Marcel J. M. Pelgrom et al. "Matching Properties of MOS Transistors". IEEE Journal of Solid-State Circuits, vol. 24, No. 5, Oct. 1989. pp. 1433-1440.

Rahul Rao et al. "A Local Random Variability Detector With Complete Digital On-Chip Measurement Circuitry". IEEE Journal of Solid-State Circuits, vol. 44, No. 9, Sep. 2009. pp. 2616-2623.

Ioannis Stamelakos et al. "Variation-Aware Voltage Island Formation for Power Efficient Near-Threshold Manycore Architectures". 2014 IEEE, 4A-3. pp. 304-310.

James Warnock et al. "Power7TM Local Clocking and Clocked Storage Elements," ISSCC 2010 / Session 9 / Digital Circuits & Sensors / 9.3. 2010 IEEE International Solid-State Circuits Conference. pp. 178-179.

Ken Yana et al. "Improving Timing Error Tolerance without Impact on Chip Area and Power Consumption". 14th Int'l Symposium on Quality Electronic Design, 2013 IEEE. pp. 373-378.

TEST STRUCTURE TO MEASURE DELAY VARIABILITY MISMATCH OF DIGITAL LOGIC PATHS

CROSS-REFERENCE TO RELATED APPLICATIONS

This patent application claims the benefit of U.S. Provisional Patent Application 62/105,902 filed Jan. 21, 2015, the complete disclosure of which, including appendices, is hereby expressly incorporated herein by reference in its entirety for all purposes.

FIELD OF THE INVENTION

The present invention relates to the electrical, electronic and computer arts, and, more particularly, to design and test of electronic circuits to take into account process variability, and the like.

BACKGROUND OF THE INVENTION

It is desirable to be able to measure mismatch in digital logic path delay variations. Current techniques employ ring oscillators (RO). RO-based approaches generally employ too many stages to accurately represent realistic path lengths in actual circuits. If the RO does have the correct number of stages, it does not have the correct slew rates. Furthermore, RO-based approaches do not account for clock skew and/or jitter at the latches at the beginning and/or end of the delay path (because there are no latches in ROs), and RO-based approaches do not generally represent actual logic gates with correct fan-outs, threshold voltages, combination(s) of logic gates, and the like. In addition, ROs are run one at a time, and measured one at a time, and ROs require a high-speed output pad for frequency measurement. Measurement of ROs averages together many passes through the logic path, e.g., a 1 ms measurement of a 1 GHz ring implies $10^6$ passes, which may average out some inherent variation of the path delay.

SUMMARY OF THE INVENTION

Principles of the invention provide a test structure to measure delay variability mismatch of digital logic paths. In one aspect, an exemplary integrated circuit includes a test block which in turn includes a plurality of identical paths; a counter selectively coupled to the plurality of identical paths to selectively obtain a count of at least one of correctly operating paths and incorrectly operating paths from each of the plurality of identical paths; and a plurality of count latches selectively coupled to the counter to store output of the counter. Each of the plurality of identical paths in turn includes a first clocked latch; a clocked logic path beginning and ending at the first clocked latch; and a clocked detection circuit coupled to the first clocked latch and the counter, which determines whether the clocked logic path is operating properly in a given clock period.

In another aspect, an exemplary integrated circuit includes a plurality of test blocks, each in turn including a plurality of identical paths; a counter selectively coupled to the plurality of identical paths to selectively obtain a count of at least one of correctly operating paths and incorrectly operating paths from each of the plurality of identical paths; and a plurality of count latches selectively coupled to the counter to store output of the counter. Each of the plurality of identical paths in turn includes a first clocked latch; a clocked logic path beginning and ending at the first clocked latch; and a clocked detection circuit coupled to the first clocked latch and the counter, which determines whether the clocked logic path is operating properly in a given clock period.

In still another aspect, an exemplary method includes enabling one test block of a plurality of test blocks of an integrated circuit as described; for the enabled test block, testing all of the plurality of identical paths to determine, with the clocked detection circuit, whether any of the plurality of identical paths fails; counting at least one of a number of passing ones of the plurality of identical paths and a number of failing ones of the plurality of identical paths; and repeating the enabling, testing, and counting steps for each of the plurality of identical test blocks.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

At least some aspects of the invention or elements thereof (e.g., control of a test) can be implemented in the form of a computer program product including a computer readable storage medium with computer usable program code for performing the method steps indicated. Furthermore, at least some aspects of the invention or elements thereof (e.g., control of a test or implementation of a design process or design structure) can be implemented in the form of a system (or apparatus) including a memory, and at least one processor that is coupled to the memory and operative to perform exemplary method steps. Yet further, in another aspect, at least some aspects of the invention or elements thereof (e.g., control of a test or implementation of a design process or design structure) can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects; by way of example and not limitation, in one or more embodiments:

All instantiations of the paths run in parallel and hence measurement time is significantly improved;

Allows for a single analog voltage measurement which represents the fraction of logic delay paths which have a delay less than a certain threshold delay;

Uses paths built with a small number of stages, as opposed to ROs which typically use many stages and are (intentionally) fairly immune to local variability;

Does not require any high-frequency off-chip signals, since the path measurement is done in-situ; this has the additional benefit of very fast and efficient data collection;

The structures' compactness enables the use of large samples for detailed statistics.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

Figure 1:
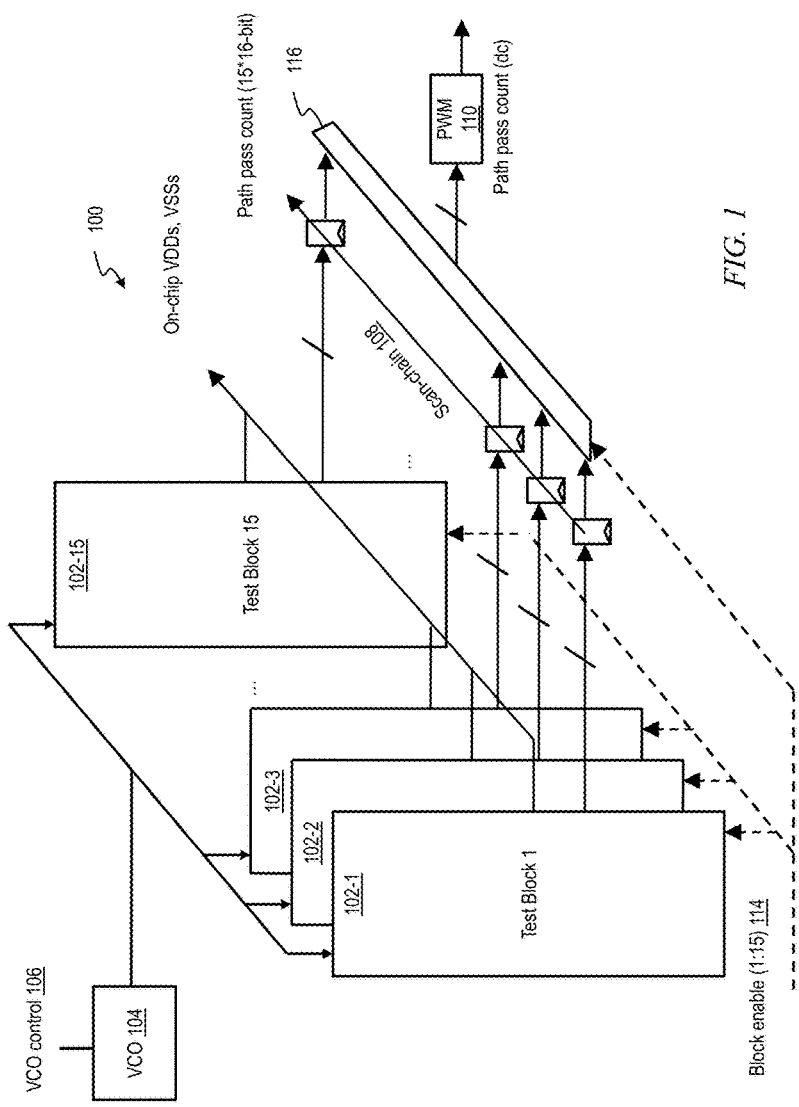
FIG. 1 shows a high-level diagram of a test structure, in accordance with an aspect of the invention.

As noted, it is desirable to be able to measure mismatch in digital logic path delay variations. Current techniques employ ring oscillators (RO). RO-based approaches generally employ too many stages to accurately represent realistic path lengths in actual circuits. If the RO does have the correct number of stages, it does not have the correct slew rates. Furthermore, RO-based approaches do not account for clock skew and/or jitter at the latches at the beginning and/or end of the delay path (because there are no latches in ROs), and RO-based approaches do not generally represent actual logic gates with correct fan-outs, threshold voltages, combination(s) of logic gates, and the like. In addition, ROs are run one at a time, and measured one at a time. In contrast, in one or more embodiments, all instantiations of the paths run in parallel and hence measurement time is significantly improved. Furthermore, ROs require a high-speed output pad for frequency measurement, whereas one or more embodiments of the invention allow for a single analog voltage measurement which represents the fraction of logic delay paths which have a delay less than a certain threshold delay. Measurement of ROs averages together many passes through the logic path, e.g., a 1 ms measurement of a 1 GHz ring implies $10^6$ passes, which may average out some inherent variation of the path delay.

One or more embodiments provide a test structure to measure local variation of logic path delay for various gate types and values of threshold voltage (VTH). In a non-limiting exemplary embodiment, the test structure can be implemented in IBM's 14 nm silicon-on-insulator (SOI) process. Each test block in the non-limiting exemplary structure has 255 copies of a different latch-bounded logic path within approximately one hundred microns. Local variation in a path at a given (positive) supply voltage VDD is measured by counting the instances that meet timing requirements as cycle time is swept. Experimental results demonstrate the dependence of variability on VTH, VDD, and stage fan-out; simulations agree with measured data.

The skilled artisan will appreciate that the yield of modern microprocessors is affected by local variability of critical paths, requiring additional margins built into timing. Local path variability depends on both the device variation and the interactions between stages due to signal slews. A thorough validation of timing models and methodology should therefore include experimental data for:

(1) stage average delay, such as from ring oscillators (ROs);

(2) stage delay local variation; and (3) local variation of path delays.

While local variability could be measured via RO-based structures, one or more embodiments of structures disclosed herein offer a variety of advantages. First, they use paths built with a small number of stages, as opposed to ROs which typically use many stages and are (intentionally) fairly immune to local variability. Second, they do not require any high-frequency off-chip signals, since the path measurement is done in-situ; this has the additional benefit of very fast and efficient data collection. Finally, the structures' compactness enables the use of large samples for detailed statistics.

FIG. 1 is a block diagram of an exemplary test structure 100, showing test blocks 102-1, 102-2, 102-3 . . . 102-15, generally designated as 102, it being understood that other embodiments could have different numbers of test blocks. Each block 102 measures statistics for a different type of path, with various VTH, gate type, and stage loading. Most paths are homogeneous, but there are also heterogeneous paths taken from processor synthesis. In the non-limiting example, the number of stages in each path was chosen for a common target cycle time and supply voltage. Thus, paths with higher fan-out (and delay) per stage had fewer stages.

One test block is enabled at a time, clocked by an on-chip voltage-controlled oscillator (VCO) 104 with an off-chip analog control 106. Two 8-bit path counts for each block are read by a scan chain 108, and also control a low-pass filtered pulse-width modulator (PWM) 110 for faster measurements. Block enable signal 114 selects which of the blocks 102 it is desired to test and also causes multiplexer 116 to pass the corresponding output to PWM 110.

Figure 2:
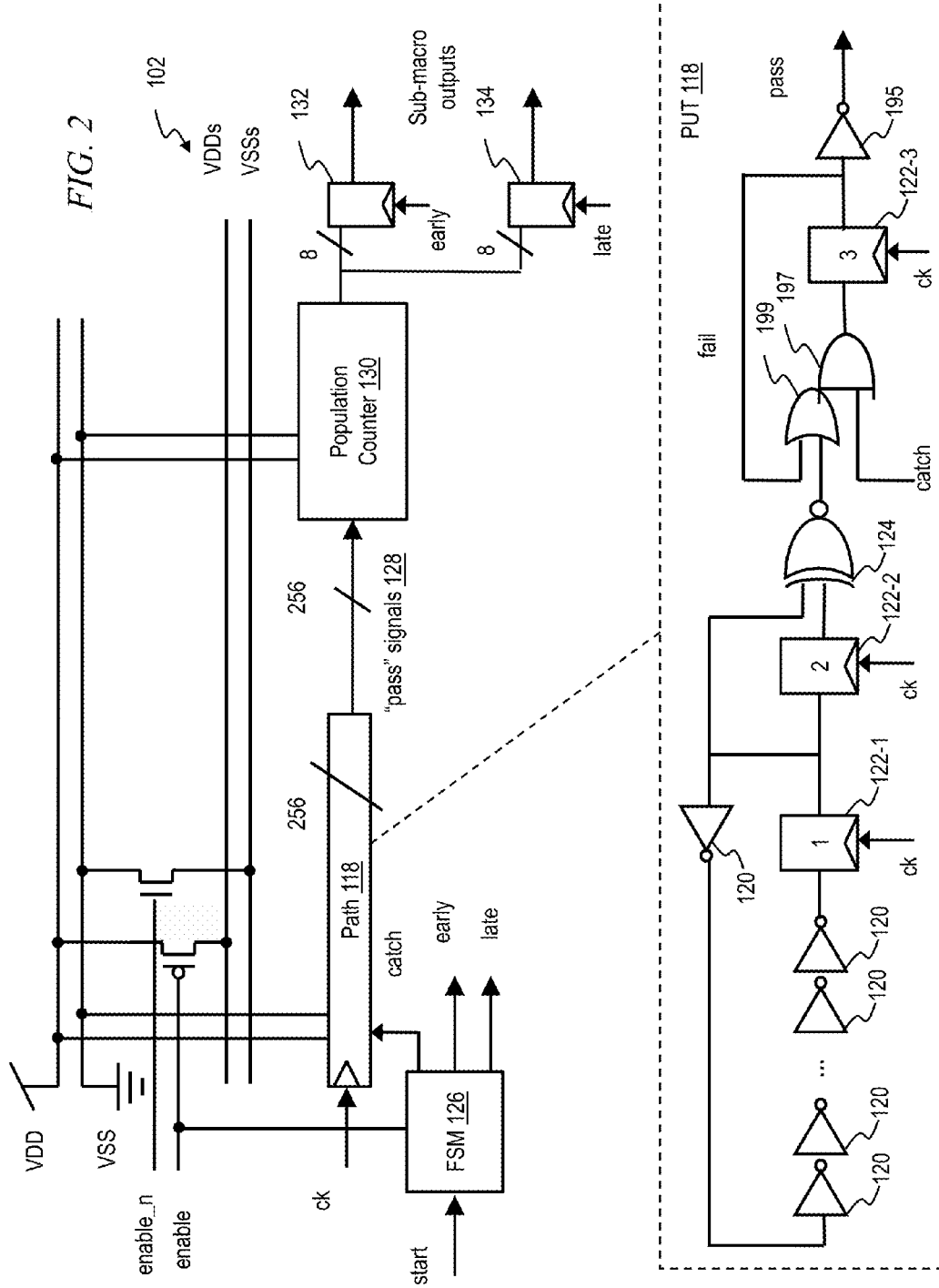
FIG. 2 shows an exemplary internal structure of a test block of FIG. 1, in accordance with an aspect of the invention.

FIG. 2 shows one test block 102 in detail. In this non-limiting example, it contains 256 copies of the path under test (PUT) 118 (enlarged inside the dashed box to show detail), which has an odd number of inverting stages 120. Each copy 118 also has three pulsed latches, labeled 122-1, 122-2, and 122-3. Regarding pulsed latches, see, e.g., J. Warnock et al., POWER7™ Local Clocking and Clocked Storage Elements, 2010 IEEE International Solid-State Circuits Conference—(ISSCC), pages 178-179, expressly incorporated herein by reference in its entirety for all purposes. Latch 1 122-1 bounds the path and toggles each cycle if the path passes (works properly at a given cycle time). Latch 2 122-2 has the previous state of latch 1 122-1. Excusive NORing (XNORing) the two with XNOR (exclusive NOR) gate 124 detects a failing cycle. Latch 3 122-3 records whether any cycle fails during a measurement.

Each time a measurement is triggered, a finite state machine (FSM) 126 in the active block generates all of the control signals to test the block in two modes. In the "short" mode, the paths are tested to see if they meet the cycle time in all of 10 cycles. In this mode, a path's delay can marginally exceed the cycle time but still pass the timing test via accumulated "cycle stealing" allowed by the pulsed latches. In the "long" mode, the same experiment is performed with a much larger timing window, virtually eliminating the cycle stealing and detecting worst-case VCO jitter for a more pessimistic measurement. The 256 pass/fail signals 128 are first encoded into binary via a population counter 130, and the short and long counts are captured in latches 132, 134 respectively.

One or more embodiments include a test structure to measure delay variability mismatch of digital logic paths; in a non-limiting exemplary embodiment, the structure is a compact structure for measurement of local variation of path delays, implemented in 14 nm SOI. One or more embodiments include a test circuit by which multiple path delays can be measured. In at least some instances, a cumulative distribution of a logic path delay can be obtained, using a combination of varying supply voltages and clock frequencies. Furthermore, one or more embodiments use multiple identical copies of the same physical path which run in parallel in order to measure variability. Advantageously, in one or more embodiments a logic path failure over multiple cycles is identified using a combination of an XNOR gate and a persistent "catch"-type latch. The pass-fail results, at multiple frequencies, characterize the statistics of the set of identical paths for a given supply voltage (and vice versa). The characterization is done on-chip in one or more embodiments, in which embodiments no high-frequency signals are required to be extracted off-chip (as opposed to the case of using ring-oscillators to measure delay). At least some embodiments use a digital PWM waveform and filtered and/or analog DC version to extract the pass-fail measurements for a set of identical paths, thus avoiding scanning out a large number of digital bits—this significantly speeds up the measurement process.

Accordingly, one or more embodiments provide a test structure 100 having a plurality of test blocks 102 each containing an array of identical paths 118, wherein each path includes a clocked latch 122-1; a logic path (inverters 120) which begins and ends at the clocked latch 122-1; and a clocked detection circuit (clocked latch 122-2 and XNOR gate 124) which detects whether the logic path is operating correctly at a given clock period. In one or more embodiments, the clocked latch 122-1 alternates states on successive clock cycles when the path is operating correctly at a given clock period (see discussion of FIG. 6). Furthermore, in some cases, the detection circuit in each path has the same clock (CK or CLK) as the clocked latch, and in some such cases, the path also has a correctness state circuit formed by OR gate 199, AND gate 197, pulsed latch 122-3, and inverter 195, which records whether the detection circuit detects incorrect operation during any clock cycle of a test interval.

Figure 6:
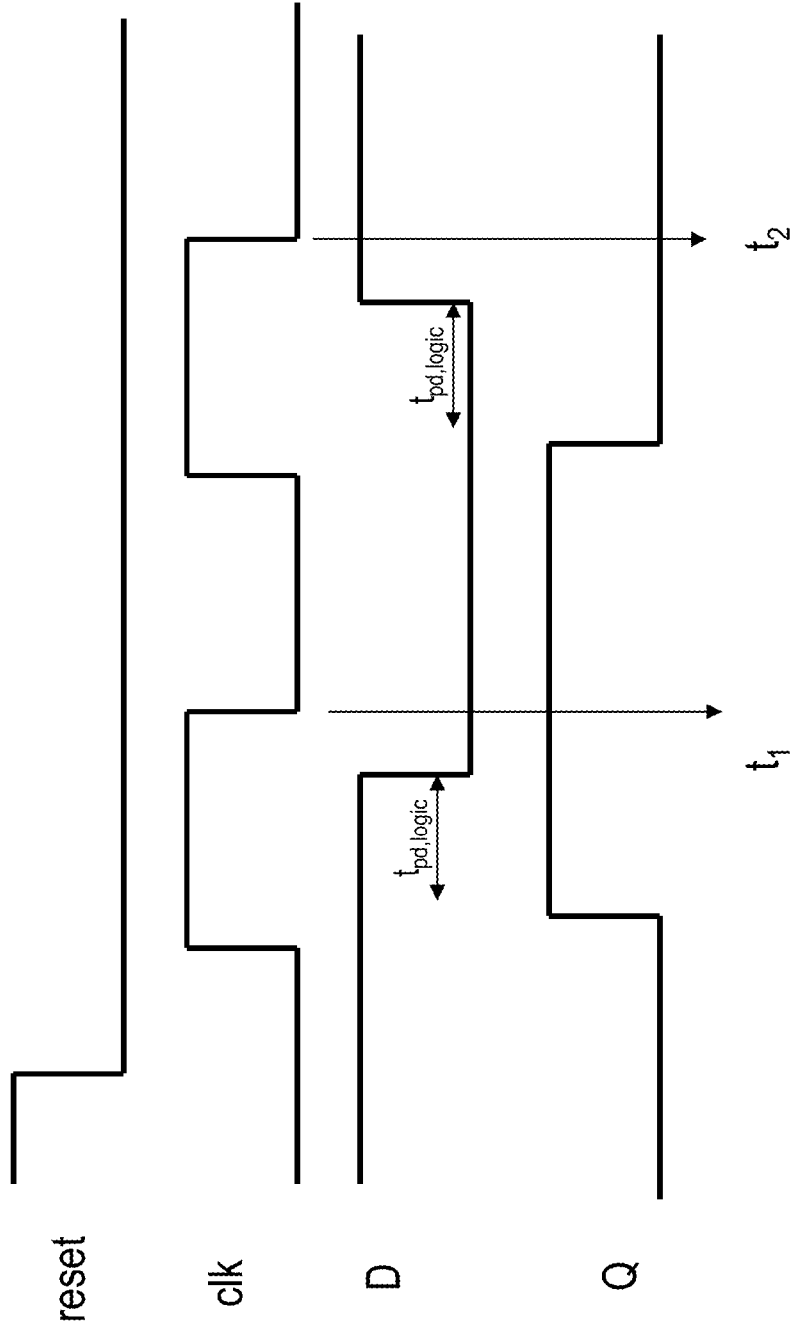
FIG. 6 shows exemplary relevant waveforms when a delay path works properly at a given cycle time, in accordance with an aspect of the invention.

FIG. 6 shows relevant waveforms for a fast path (delay path works properly at a given cycle time). The reset signal resets the pulsed latches 122-1, 122-2, and 122-3. The clock (clk or ck) is applied where shown in FIG. 2. Signal D represents the input to pulsed latch 122-1 while signal Q is its output. The falling edge of the first clock pulse is designated as $t_1$ while the falling edge of the second clock pulse is designated as $t_2$. The delay of the logic path, $t_{pd,\,logic}$, is between the rising edge of Q and the falling edge of D, and between the falling edge of Q and the rising edge of D. Q has a value of one at $t_1$ and zero at $t_2$. Latch 1 122-1 bounds the path and toggles each cycle if the path passes (works properly at a given cycle time). Latch 2 122-2 has the previous state of latch 1 122-1. The current and prior values of Q (at $t_2$, these are Q at $t_2$ and at $t_1$) are thus the inputs to XNOR gate 124. Here, exclusive OR-ing (XOR) the current and previous states of latch 122-1 (1 and 0) yields a 1 and the XNOR is the complement thereof or 0.

Figure 7:
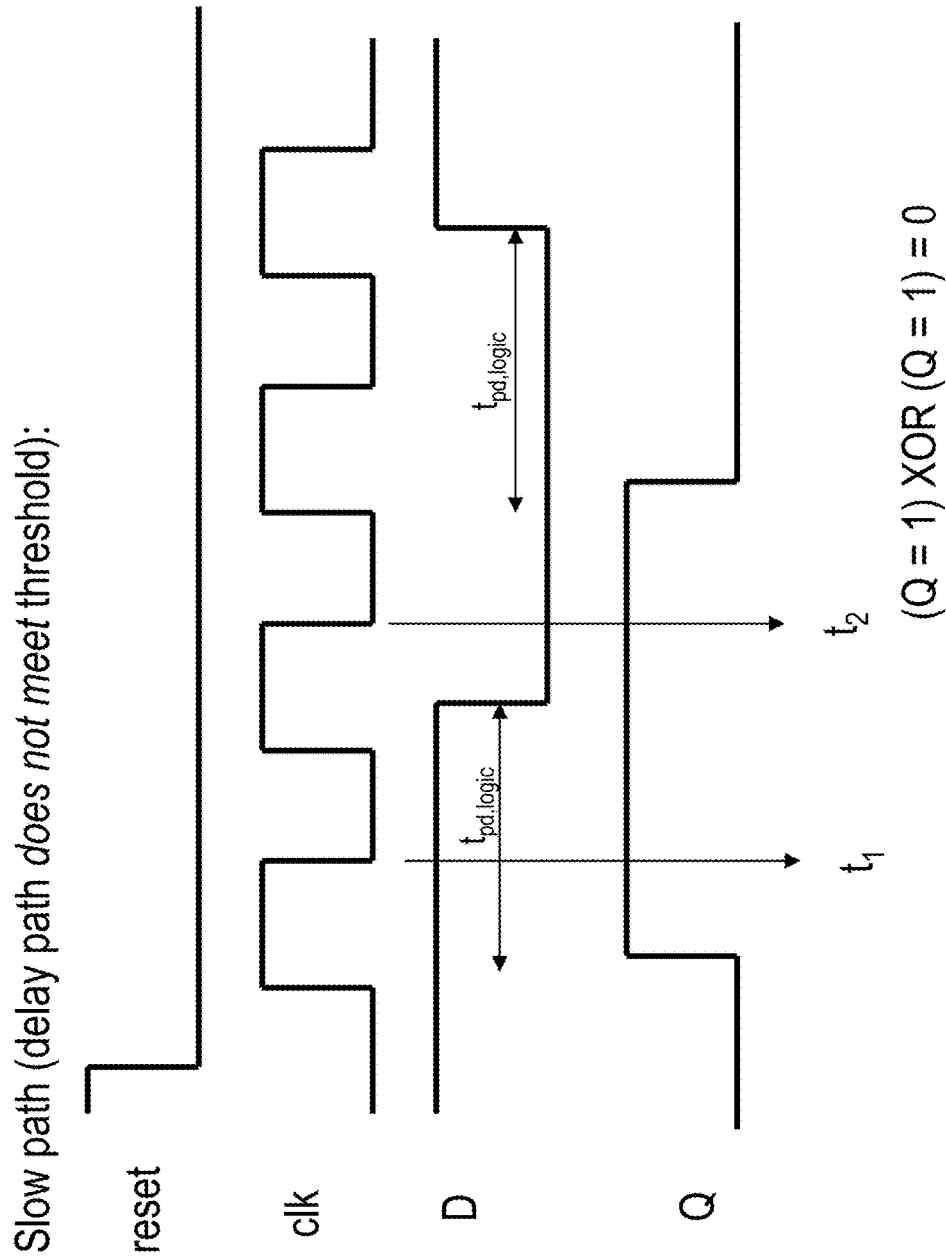
FIG. 7 shows exemplary relevant waveforms when a delay path does not work properly at a given cycle time, in accordance with an aspect of the invention.

FIG. 7 shows relevant waveforms for a slow path (delay path does not work properly at a given cycle time). The reset signal resets the pulsed latches 122-1, 122-2, and 122-3. The clock (clk or ck) is applied where shown in FIG. 2. Signal D represents the input to pulsed latch 122-1 while signal Q is its output. The falling edge of the first clock pulse is designated as $t_1$ while the falling edge of the second clock pulse is designated as $t_2$. The delay of the logic path, $t_{pd,\,logic}$, is between the rising edge of Q and the falling edge of D, and between the falling edge of Q and the rising edge of D. Here, $t_{pd,\,logic}$ is longer than the cycle time and Q has a value of one at $t_1$ and one at $t_2$. The current and prior values of Q are thus the inputs to XNOR gate 124. Here, exclusive OR-ing (XOR) the current and previous states of latch 122-1 (1 and 1) yields a 0 and the XNOR is the complement thereof or 1.

Thus, from the discussion of FIGS. 6 and 7, the output of XNOR gate 124 is 1 when there has been a failure. Thus, OR gate 199 will OR together the output of XNOR gate 124 and the "fail" input indicating a previous failure and return a true when there has been a current and/or previous failure. The AND gate 197 will AND together the output of OR gate 199 and the "catch" signal, and return a true only if both inputs are true (i.e., record errors only if "catch" signal activated). The output of AND gate 197 is passed to pulsed latch 122-3, which will record any current or previous error depending on the value of the catch signal input to AND gate 197. In particular, in some such instances, the correctness state circuit has the catch input and an internal state; the state depends on the catch input such that if the catch input is false, the state will be "correct" (output of latch 122-3 is 0) in the next clock cycle; if the catch input is true the state will be "correct" only if it was correct in the previous cycle and the path operated correctly—otherwise it will be "incorrect" (output of latch 122-3 is 1).

In some instances, the test structure also contains a counting circuit 130 which converts the plurality of correct/incorrect states to a (numeric) passing count.

In some instances, the test structure contains a circuit 110 to convert the passing count to a low-frequency pulse-width-modulated signal and/or to a voltage.

In some embodiments, the test structure contains count latches 132 and/or 134 which hold the passing count.

In some instances, the test structure contains a sequencing circuit (e.g., FSM 126) which, when triggered by a start input controls the clocks at the set of state circuits and count latches; the sequencing circuit's states include reset, catch, count, and latch. The transition from reset to catch is triggered by the leading edge of an external start input. In the catch state, the catch signal is true. The FSM controls the transitions from catch to count, then to latch a predetermined number of cycles later. In the latch state, the early output of the FSM couples the count latches 132 to the output of the counter 130. In some instances, the FSM returns to the reset state after the latch state. In some instances, the FSM returns to the catch state after the latch state, until the trailing edge of the start input, at which time it automatically transitions to the count state and a latch2 state. In the latch2 state, the late output of the FSM couples the count latches 134 to the output of the counter 130.

In some embodiments, the test structure is equipped (for example, with a scan chain 108) to read the data in the count latches at a frequency arbitrarily lower than the frequency at which the paths are clocked.

Referring again to FIG. 2, one or more embodiments test multiple copies (e.g. 256) of the same logic path, and identify the number of failures. Regarding the multiple macros, in one or more embodiments, sweep each across supply voltage and frequency. In at least some embodiments, identify failures soon after startup (as at 132) and at a later point (as at 134) (for jitter effects).

As indicated, one or more embodiments carry out a pass-fail check over multiple cycles. In particular, a failure can be detected over multiple cycles, and the output of an inverting path is compared to the input in one cycle, and a failure is detected in the next cycle. Once a failure is detected, it is stored until reset by the FSM 126. In FIG. 2, the output of XNOR gate 124 will be a zero when the path works properly at a given cycle time, and a one when the path does not work properly at a given cycle time.

One or more embodiments employ a PWM 110 for off-chip data extraction. Conventional methods scan out serially, and are slow. In contrast, one or more embodiments modulate the duty-cycle of a slow CK based on pass/failure data. It is possible to measure the average voltage of the slow CK to extract the fraction of passing paths.

Consider the non-limiting example of a single pin with $T=(2^{N+1})(T_{OSC})$, with duty cycle modulated from ¼ to ¾. For moderate N (e.g. 8) and slow scan-chain clock (e.g. 500× slower than oscillator), this method can improve testing time significantly. In at least some instances, the PWM CK is free-running (no "enable" signal). This approach involves integration of the PWM waveform on the test instrument (moderately easy), and in principle, does not require measuring pulse-width on probed output within $\sim T_{OSC}$.

In one or more embodiments, a cumulative distribution of logic path delays can be obtained, using a combination of varying clock frequencies and a pass/fail detector at the end of the logic delay chain. The count (number of paths) can be plotted versus the clock period (T). In some instances, data can effectively be presented as shown in, e.g., FIG. 3.

One or more embodiments thus provide a loop including an inverting logic path and a clocked latch, such that if the path delay is less than the clock period, the latch output will alternate states on successive clock cycles. One or more embodiments provide circuitry to test if this alternation occurs at a given clock period. At least some instances provide an array of such loops. One or more embodiments provide circuitry to output the result of this test for all instances of the loops, via a dc voltage level or a low frequency digital output signal.

Exemplary Experimental Results

Figure 3:
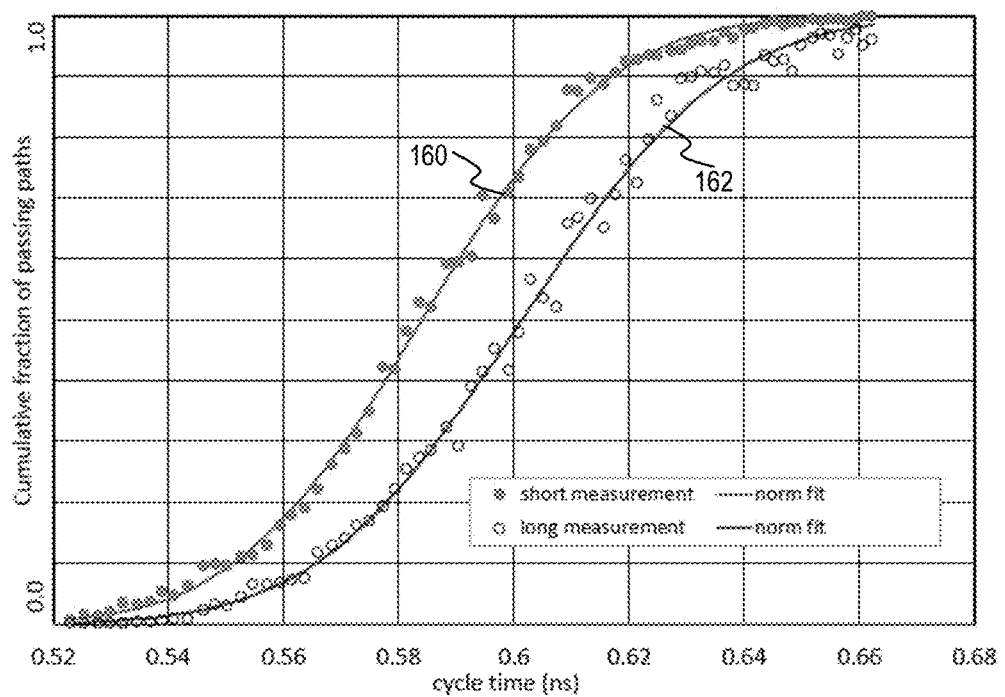
FIG. 3 shows short and long measurements of distribution of passing paths vs. cycle time, in accordance with an aspect of the invention.

FIG. 3 shows the difference between short and long measurement intervals (10 and about 2000 cycles, respectively and reference numbers 160, 162 respectively) of one test block. The normal CDFs fitted to the two data sets differ by a shift in the VCO's cycle time; the long measurement almost totally prevents cycle stealing and includes worst-case supply noise and cycle-to-cycle clock jitter. The CDFs' widths are the same, however; the shift does not interfere with the measurement of the PUT's local variability. In particular, FIG. 3 depicts test block distribution (number of passing paths vs. normalized cycle time), comparing short and long measurement sequences.

Recapitulation

Given the discussion thus far, it will be appreciated that, in general terms, an exemplary integrated circuit 100, according to an aspect of the invention, includes one or more test blocks 102. Each test block 102 in turn includes a plurality of identical paths 118 and a counter 130 selectively coupled to the plurality of identical paths to selectively obtain a count of at least one of correctly operating paths and incorrectly operating paths from each of the plurality of identical paths. Each test block 102 further includes a plurality of count latches 132, 134 selectively coupled to the counter to store output of the counter. Each of the plurality of identical paths in turn includes a first clocked latch 122-1; a clocked logic path beginning and ending at the first clocked latch; and a clocked detection circuit coupled to the first clocked latch and the counter, which determines whether the clocked logic path is operating properly in a given clock period.

The skilled artisan will thus appreciate that in one aspect, an exemplary integrated circuit includes a block 102 (some embodiments have more than one block 102 but this is optional). Where there are multiple blocks, the blocks need not be identical. However, within a given test block, there are a plurality of identical paths, operating at the same time on the same clock, and a measurement is made regarding how many of the identical paths are working properly and how many are not. Of course, the number of identical paths that are working properly and the number that are not working properly do not necessarily both need to be explicitly counted; it is possible to measure either one and then determine the other by subtracting from the total number of paths.

In a non-limiting exemplary embodiment, the clocked logic path includes a plurality of inverters 120; however, in other embodiments, the clocked logic path could have a different form.

In some cases, the clocked detection circuit includes a second clocked latch 122-2 having an input coupled to an output of the first clocked latch and having an output, and an XNOR gate 124 having a first input coupled to the output of the first clocked latch, a second input coupled to the output of the second clocked latch, and an output.

In one or more embodiments, for each of the plurality of identical paths 118, the first clocked latch 122-1 alternates state on successive clock cycles when the clocked logic path is operating properly for the successive clock cycles.

At least some embodiments include a scan chain 108 selectively coupled to an input and output of the integrated circuit 100 and to the count latches 132, 134, and a clock (e.g., VCO 104), wherein, for each of the plurality of identical paths 118, the first clocked latch 122-1 and the clocked detection circuit are both clocked with the clock (CK or CLK). The skilled artisan will appreciate that the count latches are on the IC 100 in the test block 102 and the scan chain 108 is coupled to the I/O of the IC.

In at least some cases, each of the plurality of identical paths further includes a correctness state circuit, which records whether the clocked detection circuit detects incorrect operation during any clock cycle of a test interval. The clocked detection circuit is coupled to the counter through the correctness state circuit. In some such cases, the correctness state circuit is selectively operable via a catch input signal which defines the test interval.

In a non-limiting example, the correctness state circuit includes an OR gate 199 having a first input coupled to the output of the XNOR gate, a second input, and an output; an AND gate 197 having a first input coupled to the output of the OR gate; a second input coupled to the catch input signal, and an output; and a third clocked latch 122-3 having an input coupled to the output of the AND gate and an output coupled to the second input of the OR gate. The correctness state circuit may optionally further include an inverter 195 having an input coupled to the output of the third clocked latch and having an output.

The clock could be, for example, VCO 104.

Some embodiments further include a low-pass filtered pulse-width modulator 110 selectively coupled to the count latches.

In at least some embodiments, the test block 102 further includes a finite state machine 126 which generates control signals to test the test block; namely the catch signal and an enable signal to selectively couple the counter and a set of the count latches.

In some cases, the pulse width of the catch signal is controlled by the finite state machine to be a predetermined number of clock cycles. In some cases, the pulse width of the catch signal is externally controlled by an input of the integrated circuit. Thus, in some embodiments, the "short" test interval is controlled by the FSM while the "long" test interval goes on until the external signal cuts off.

Furthermore, given the discussion thus far, it will be appreciated that, in general terms, an exemplary method, according to another aspect of the invention, includes enabling one test block of a plurality of test blocks 102 of an integrated circuit 100, wherein each of the plurality of test blocks in turn includes a plurality of identical paths 118, a counter 130 selectively coupled to the plurality of identical paths to selectively obtain a count of at least one of correctly operating paths and incorrectly operating paths from each of the plurality of identical paths; and a plurality of count latches 132, 134 selectively coupled to the counter to store output of the counter. Furthermore, each of the plurality of identical paths 118 in turn includes a first clocked latch 122-1; a clocked logic path beginning and ending at the first clocked latch; and a clocked detection circuit coupled to the first clocked latch and the counter, which determines whether the clocked logic path is operating properly in a given clock period. A further step includes, for the enabled test block, testing all of the plurality of identical paths to determine, with the clocked detection circuit, whether any of the plurality of identical paths fails. Even further steps include counting at least one of a number of passing ones of the plurality of identical paths and a number of failing ones of the plurality of identical paths; and repeating the enabling, testing, and counting steps for each of the plurality of identical test blocks.

In one or more embodiments, the clocked detection circuit includes a second clocked latch 122-2 having an input coupled to an output of the first clocked latch and having an output; and an XNOR gate 124 having a first input coupled to the output of the first clocked latch, a second input coupled to the output of the second clocked latch, and an output; and the testing to determine, with the clocked detection circuit, whether any of the plurality of identical paths fails includes exclusive OR-ing the output of the first clocked latch and the output of the second clocked latch with the XNOR gate.

As noted, some embodiments include multiple test blocks 102. Thus, in another exemplary embodiments, an integrated circuit includes a plurality of test blocks 102, each in turn including a plurality of identical paths 118; a counter 130 selectively coupled to the plurality of identical paths to selectively obtain a count of at least one of correctly operating paths and incorrectly operating paths from each of the plurality of identical paths; and a plurality of count latches 132, 134 selectively coupled to the counter to store output of the counter. Each of the plurality of identical paths in turn includes a first clocked latch; a clocked logic path beginning and ending at the first clocked latch; and a clocked detection circuit coupled to the first clocked latch and the counter, which determines whether the clocked logic path is operating properly in a given clock period, as described above. As noted, the paths are identical on a given block but paths on one block are not necessarily the same as paths on another block.

In some instances, for each of the plurality of identical paths, the first clocked latch alternates state on successive clock cycles when the clocked logic path is operating properly for the successive clock cycles.

Some embodiments further include a scan chain 108 selectively coupled to an input and output of the integrated circuit and to the count latches; and a clock; for each of the plurality of identical paths, the first clocked latch and the clocked detection circuit are both clocked with the clock. The skilled artisan will appreciate that the count latches are on the IC in the test block, and the scan chain is coupled to the I/O of the IC 100 (I/O not explicitly called out to avoid clutter).

In some cases, each of the plurality of identical paths further includes a correctness state circuit as described above, which records whether the clocked detection circuit detects incorrect operation during any clock cycle of a test interval. The clocked detection circuit is coupled to the counter through the correctness state circuit. Some embodiments further include a low-pass filtered pulse-width modulator 110 selectively coupled to the count latches.

One or more embodiments as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 5:
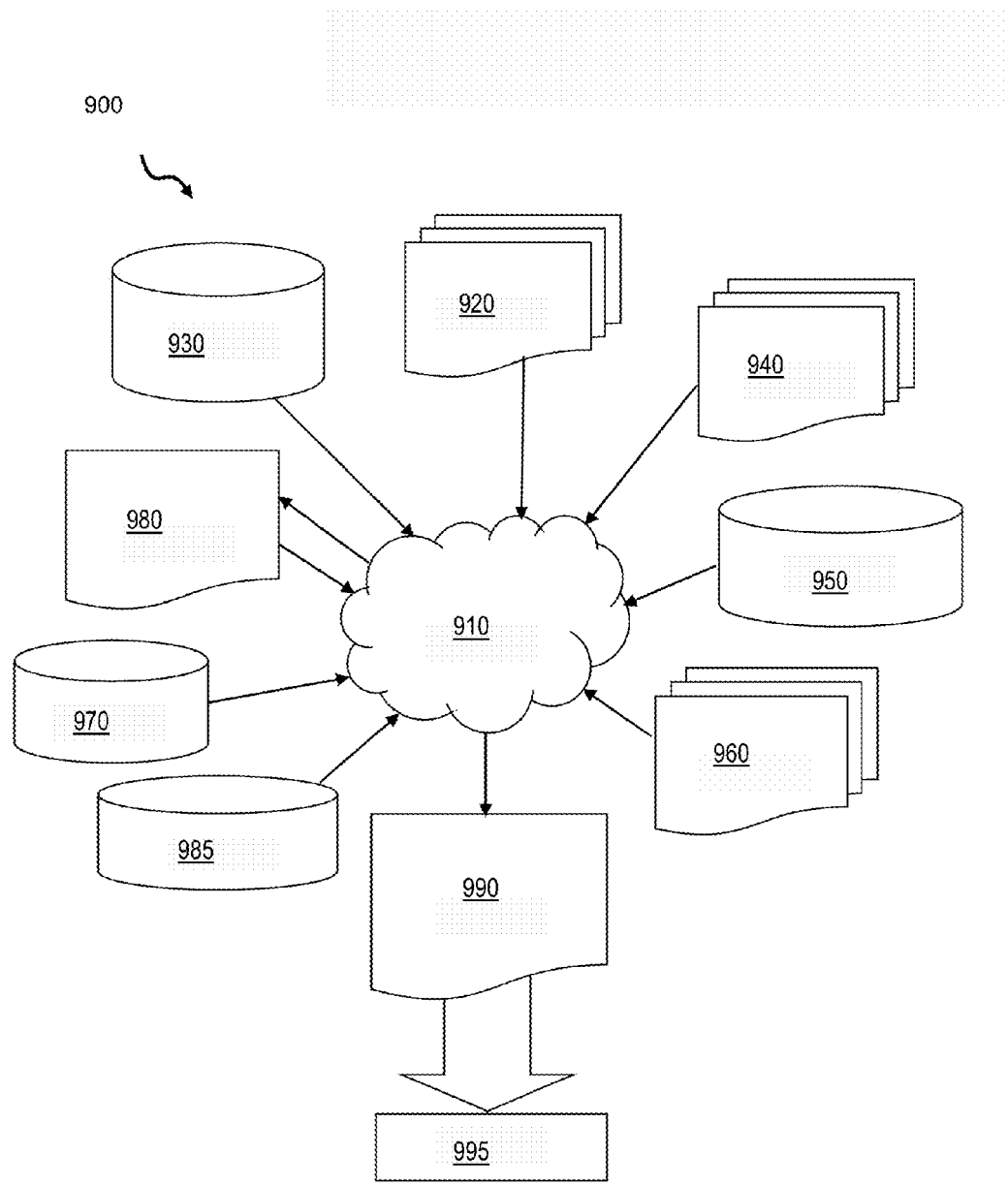
FIG. 5 is a flow diagram of a design process used in semiconductor design, manufacture, and/or test.

FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-2. As such, design structure 920 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-2 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-2. In one embodiment, design structure 990 may comprise a compiled, executable HDL simulation model that functionally simulates the devices shown in FIGS. 1-2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-2. Design structure 990 may then proceed to a stage 995 where, for example, design structure 990: proceeds to tape-out, is released to manufacturing, is released to a mask house, is sent to another design house, is sent back to the customer, etc.

Exemplary System and Article of Manufacture Details—
Part 1

At least some aspects of the invention or elements thereof (e.g., control of a test) can be implemented in the form of an apparatus including a memory and at least one processor that is coupled to the memory and operative to perform exemplary method steps.

Figure 4:
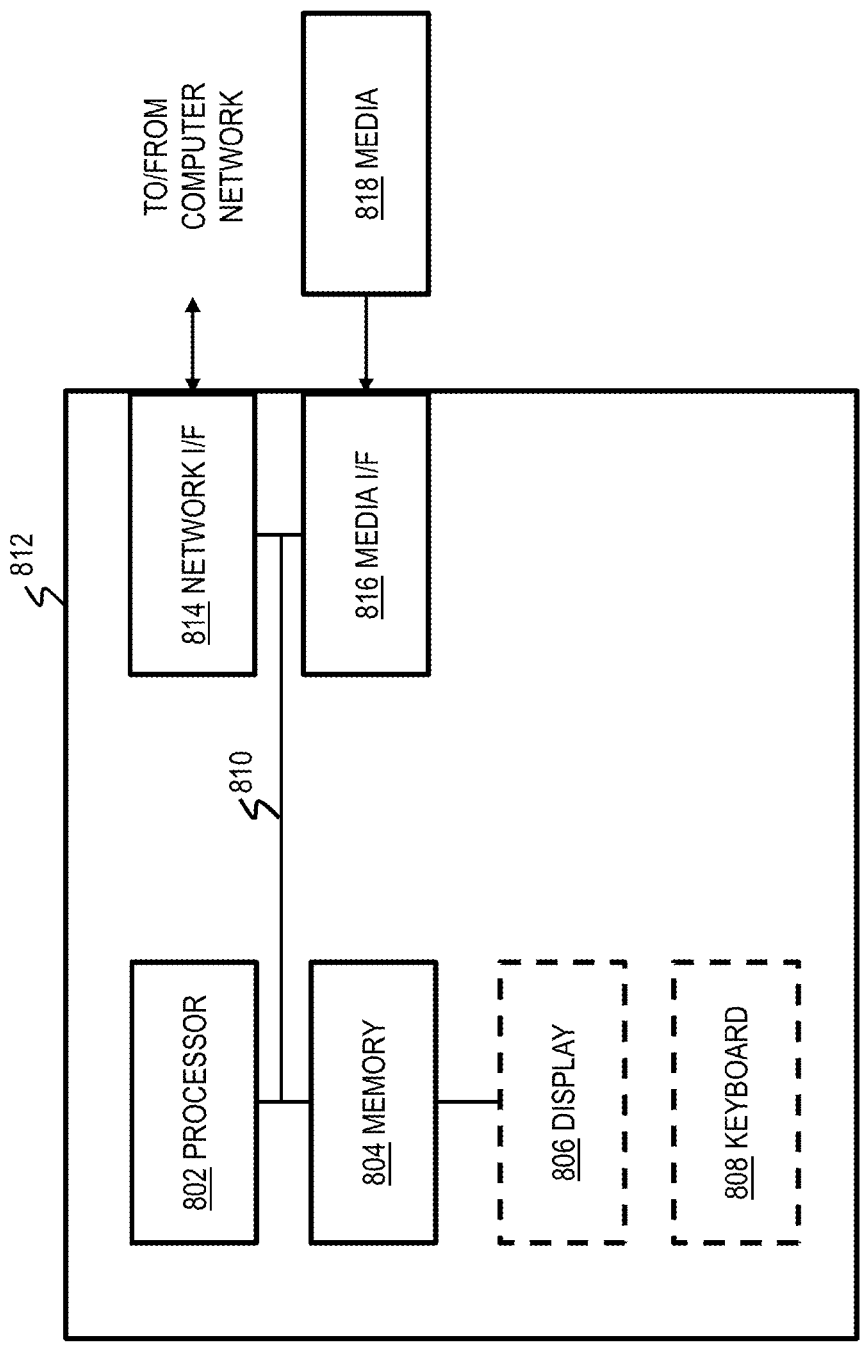
FIG. 4 depicts a computer system that may be useful in implementing one or more aspects and/or elements of the invention (e.g., control of a test)

Such aspects can make use of software running on a general purpose computer or workstation. With reference to FIG. 4, such an implementation might employ, for example, a processor 802, a memory 804, and an input/output interface formed, for example, by a display 806 and a keyboard 808. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 802, memory 804, and input/output interface such as display 806 and keyboard 808 can be interconnected, for example, via bus 810 as part of a data processing unit 812. Suitable interconnections, for example via bus 810, can also be provided to a network interface 814, such as a network card, which can be provided to interface with a computer network, and to a media interface 816, such as a diskette or CD-ROM drive, which can be provided to interface with media 818.

In some instances, unit 812 controls a test via interface 814 or the like.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 802 coupled directly or indirectly to memory elements 804 through a system bus 810. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 808, displays 806, pointing devices, and the like) can be coupled to the system either directly (such as via bus 810) or through intervening I/O controllers (omitted for clarity).

Network adapters such as network interface 814 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 812 as shown in FIG. 4) running a server program. It will be understood that such a physical server may or may not include a display and keyboard.

It should be noted that any of the methods described herein can include an additional step of providing a system comprising distinct software modules embodied on a computer readable storage medium; the modules can include, for example, modules for any or all of the computer-implemented test control described herein. The testing can then be controlled using the distinct software modules and/or submodules of the system executing on one or more hardware processors 802. Further, a computer program product can include a computer-readable storage medium with code adapted to be implemented to carry out control of testing described herein, including the provision of the system with the distinct software modules. In addition, pertinent databases in which output data may be stored typically include records in persistent storage accessed by database management system software. A portal or user interface may include hypertext markup language served out by a server to one or more client computers which, when executed on a browser of the client computer, creates a graphical user interface (GUI).

Exemplary System and Article of Manufacture Details—Part 2

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:
1. An integrated circuit comprising:
  a test block comprising:
    a plurality of identical paths;
    a counter selectively coupled to said plurality of identical paths to selectively obtain a count of at least one of correctly operating paths and incorrectly operating paths from each of said plurality of identical paths; and
    a plurality of count latches selectively coupled to said counter to store output of said counter;
    wherein each of said plurality of identical paths in turn comprises:
      a first clocked latch;
      a clocked logic path beginning and ending at said first clocked latch; and
      a clocked detection circuit coupled to said first clocked latch and said counter, which determines whether said clocked logic path is operating properly in a given clock period.

2. The integrated circuit of claim 1, wherein, for each of said plurality of identical paths, said first clocked latch alternates state on successive clock cycles when said clocked logic path is operating properly for said successive clock cycles.

3. The integrated circuit of claim 2, further comprising:
  a scan chain selectively coupled to an input and output of said integrated circuit and to said count latches; and
  a clock, wherein, for each of said plurality of identical paths, said first clocked latch and said clocked detection circuit are both clocked with said clock.

4. The integrated circuit of claim 3, wherein each of said plurality of identical paths further comprises a correctness state circuit, which records whether said clocked detection circuit detects incorrect operation during any clock cycle of a test interval, said clocked detection circuit being coupled to said counter through said correctness state circuit.

5. The integrated circuit of claim 4, wherein, for each of said plurality of identical paths, said correctness state circuit is selectively operable via a catch input signal which defines said test interval.

6. The integrated circuit of claim 5, further comprising a low-pass filtered pulse-width modulator selectively coupled to said count latches.

7. The integrated circuit of claim 5, wherein said clock comprises a voltage controlled oscillator.

8. The integrated circuit of claim 5, wherein:
said clocked detection circuit comprises:
a second clocked latch having an input coupled to an output of said first clocked latch and having an output; and
an XNOR gate having a first input coupled to said output of said first clocked latch, a second input coupled to said output of said second clocked latch, and an output.

9. The integrated circuit of claim 8, wherein said correctness state circuit comprises:
an OR gate having a first input coupled to said output of said XNOR gate, a second input, and an output;
an AND gate having a first input coupled to said output of said OR gate; a second input coupled to said catch input signal, and an output; and
a third clocked latch having an input coupled to said output of said AND gate and an output coupled to said second input of said OR gate.

10. The integrated circuit of claim 9, wherein said correctness state circuit further comprises an inverter having an input coupled to said output of said third clocked latch and having an output.

11. The integrated circuit of claim 5, wherein said test block further comprises a finite state machine which generates control signals to test said test block, namely said catch signal and an enable signal to selectively couple said counter and a set of said count latches.

12. The integrated circuit of claim 11, wherein a pulse width of said catch signal is controlled by said finite state machine to be a predetermined number of clock cycles.

13. The integrated circuit of claim 11, wherein a pulse width of said catch signal is externally controlled by an input of said integrated circuit.

14. A method comprising:
enabling one test block of a plurality of test blocks of an integrated circuit, wherein each of said plurality of test blocks in turn comprises:
a plurality of identical paths;
a counter selectively coupled to said plurality of identical paths to selectively obtain a count of at least one of correctly operating paths and incorrectly operating paths from each of said plurality of identical paths; and
a plurality of count latches selectively coupled to said counter to store output of said counter; and wherein each of said plurality of identical paths in turn comprises:
a first clocked latch;
a clocked logic path beginning and ending at said first clocked latch; and
a clocked detection circuit coupled to said first clocked latch, and said counter, which determines whether said clocked logic path is operating properly in a given clock period;
for said enabled test block, testing all of said plurality of identical paths to determine, with said clocked detection circuit, whether any of said plurality of identical paths fails;
counting at least one of a number of passing ones of said plurality of identical paths and a number of failing ones of said plurality of identical paths; and
repeating said enabling, testing, and counting steps for each of said plurality of identical test blocks.

15. The method of claim 14, wherein:
said clocked detection circuit comprises:
a second clocked latch having an input coupled to an output of said first clocked latch and having an output; and
an XNOR gate having a first input coupled to said output of said first clocked latch, a second input coupled to said output of said second clocked latch, and an output; and
said testing to determine, with said clocked detection circuit, whether any of said plurality of identical paths fails comprises exclusive OR-ing said output of said first clocked latch and said output of said second clocked latch with said XNOR gate.

16. An integrated circuit comprising:
a plurality of test blocks, each in turn comprising:
a plurality of identical paths;
a counter selectively coupled to said plurality of identical paths to selectively obtain a count of at least one of correctly operating paths and incorrectly operating paths from each of said plurality of identical paths; and
a plurality of count latches selectively coupled to said counter to store output of said counter;
wherein each of said plurality of identical paths in turn comprises:
a first clocked latch;
a clocked logic path beginning and ending at said first clocked latch; and
a clocked detection circuit coupled to said first clocked latch and said counter, which determines whether said clocked logic path is operating properly in a given clock period.

17. The integrated circuit of claim 16, wherein, for each of said plurality of identical paths, said first clocked latch alternates state on successive clock cycles when said clocked logic path is operating properly for said successive clock cycles.

18. The integrated circuit of claim 17, further comprising:
a scan chain selectively coupled to an input and output of said integrated circuit and to said count latches; and
a clock, wherein, for each of said plurality of identical paths, said first clocked latch and said clocked detection circuit are both clocked with said clock.

19. The integrated circuit of claim 18, wherein each of said plurality of identical paths further comprises a correctness state circuit, which records whether said clocked detection circuit detects incorrect operation during any clock cycle of a test interval, said clocked detection circuit being coupled to said counter through said correctness state circuit.

20. The integrated circuit of claim 19, further comprising a low-pass filtered pulse-width modulator selectively coupled to said count latches.

\* \* \* \* \*